US008522125B1

(12) United States Patent
Feng et al.

(10) Patent No.: US 8,522,125 B1
(45) Date of Patent: Aug. 27, 2013

(54) SYSTEM AND METHOD FOR EFFICIENT HORIZONTAL MAXIMUM DISTANCE SEPARABLE RAID

(75) Inventors: Jun Feng, Vestal, NY (US); Yu Chen, Vestel, NY (US)

(73) Assignee: The Research Foundation of State University of New York, Binghamton, NY (US)

( * ) Notice: Subject to any disclaimer, the term of this patent is extended or adjusted under 35 U.S.C. 154(b) by 192 days.

(21) Appl. No.: 13/084,205

(22) Filed: Apr. 11, 2011

Related U.S. Application Data

(60) Provisional application No. 61/322,568, filed on Apr. 9, 2010.

(51) Int. Cl.
 *H03M 13/00* (2006.01)
(52) U.S. Cl.
 USPC ........................................................ 714/801
(58) Field of Classification Search
 USPC ........................................................ 714/801
 See application file for complete search history.

(56) References Cited

U.S. PATENT DOCUMENTS

| | | | |
|---|---|---|---|
| 8,024,632 B1 * | 9/2011 | Konrad | 714/733 |
| 2001/0049808 A1 * | 12/2001 | Brown | 714/758 |
| 2006/0015692 A1 * | 1/2006 | Schnapp et al. | 711/154 |

* cited by examiner

*Primary Examiner* — Albert Decady
*Assistant Examiner* — Enam Ahmed
(74) *Attorney, Agent, or Firm* — Steven M. Hoffberg; Ostrolenk Faber LLP

(57) ABSTRACT

In recent years, researchers have found that some XOR erasure codes lead to higher performance and better throughput in fault-tolerant distributed data storage applications. However, little consideration has been given to the advantages of parallel processing or hardware implementations taking advantage of the emergence of multi-core processors. An efficient horizontal MDS-like (Maximum Distance Separable) RAID-6 scheme, called EEO, is provided which significantly improves the performance of the decoding procedure in parallel implementations with little storage overhead. EEO is the fastest and most efficient double disk failure recovering algorithm in RAID-6, at the cost of only two more parity symbols. In practice, it is very useful for application where high decoding throughput is desired.

27 Claims, 5 Drawing Sheets

| $d_{0,0}$ | $d_{0,1}$ | $d_{0,2}$ | $d_{0,3}$ | $d_{0,4}$ | $c_{0,0}$ | $c_{0,1}$ |
|---|---|---|---|---|---|---|
| $d_{1,0}$ | $d_{1,1}$ | $d_{1,2}$ | $d_{1,3}$ | $d_{1,4}$ | $c_{1,1}$ | $c_{1,1}$ |
| $d_{2,0}$ | $d_{2,1}$ | $d_{2,2}$ | $d_{2,3}$ | $d_{2,4}$ | $c_{2,0}$ | $c_{2,1}$ |
| $d_{3,0}$ | $d_{3,1}$ | $d_{3,2}$ | $d_{3,3}$ | $d_{3,4}$ | $c_{3,0}$ | $c_{3,1}$ |
| $d_{4,0}$ | $d_{4,1}$ | $d_{4,2}$ | $d_{4,3}$ | $d_{4,4}$ | $c_{4,0}$ | $c_{4,1}$ |

SYSTEM AND METHOD FOR EFFICIENT HORIZONTAL MAXIMUM DISTANCE SEPARABLE RAID

FIELD OF THE INVENTION

The present invention relates to the field of parity-encoded redundant storage systems.

BACKGROUND OF THE INVENTION

In modern storage systems, RAID (Redundant Array of Independent Disks) techniques are known as the preferable technique to achieve high performance and reliability. Among the well known RAID techniques, RAID-6 (block-level striping with double distributed parity), which can tolerate two failure-disks, has the best balance between storage efficiency and reliability. Erasure-coding technologies can provide both high fault tolerance and high storage efficiency [4]. RAID-6 makes larger RAID groups more practical, especially for high-availability systems. This becomes increasingly important as large-capacity drives lengthen the time needed to recover from the failure of a single drive. Single-parity RAID levels are as vulnerable to data loss as a RAID 0 array until the failed drive is replaced and its data rebuilt; the larger the drive, the longer the rebuild will take. Double parity gives time to rebuild the array without the data being at risk if a single additional drive fails before the rebuild is complete.

While all the erasure coding techniques are feasible in practice, coding schemes based on the Reed-Solomon (RS) code are most popular with their MDS (Maximum Distance Separable) property. The information dispersal algorithm [9] or the Parchive adopted in some schemes or systems [6] indeed are derived from the RS codes. To date, several classes of horizontal MDS array codes have been successfully designed to simultaneously recover double storage node failure including the EVENODD code [1], [2]X code [11], RDP (Row-Diagonal Parity) scheme [3], Libertine Code [7] or their derivative schemes [5], [10].

Although X-code [11] is an elegant two-erasure code, it is not a RAID code since it is a vertical code and does not fit the RAID-6 specification of having coding devices P and Q, where P is a simple parity device [7]. Actually, all non-MDS codes and vertical codes are not implementable in RAID-6 systems [7]. A recent examination of the performance of the codes for RAID-6 using Classic Reed-Solomon codes and Cauchy Reed-Solomon codes based on Open-Source Erasure Coding Libraries concluded that special-purpose RAID-6 codes vastly outperform their general-purpose counterparts and RDP performs the best of these by a narrow margin [8].

A RAID 5 uses block-level striping with parity data distributed across all member disks. A concurrent series of blocks (one on each of the disks in an array) is collectively called a stripe. If another block, or some portion thereof, is written on that same stripe, the parity block, or some portion thereof, is recalculated and rewritten. For small writes, this requires: Read the old data block; Read the old parity block; Compare the old data block with the write request. For each bit that has flipped (changed from 0 to 1, or from 1 to 0) in the data block, flip the corresponding bit in the parity block; Write the new data block; and Write the new parity block. The disk used for the parity block is staggered from one stripe to the next, hence the term distributed parity blocks. RAID 5 writes are expensive in terms of disk operations and traffic between the disks and the controller. The parity blocks are not read on data reads, since this would add unnecessary overhead and would diminish performance. The parity blocks are read, however, when a read of blocks in the stripe fails due to failure of any one of the disks, and the parity block in the stripe are used to reconstruct the errant sector. The CRC error is thus hidden from the main computer. Likewise, should a disk fail in the array, the parity blocks from the surviving disks are combined mathematically with the data blocks from the surviving disks to reconstruct the data from the failed drive on-the-fly.

In the event of a system failure while there are active writes, the parity of a stripe may become inconsistent with the data. If this is not detected and repaired before a disk or block fails, data loss may ensue as incorrect parity will be used to reconstruct the missing block in that stripe. Battery-backed cache and similar techniques are commonly used to reduce the window of opportunity for this to occur. The same issue occurs for RAID-6.

RAID 5 implementations suffer from poor performance when faced with a workload which includes many writes which are smaller than the capacity of a single stripe. This is because parity must be updated on each write, requiring read-modify-write sequences for both the data block and the parity block. More complex implementations may include a non-volatile write back cache to reduce the performance impact of incremental parity updates. Large writes, spanning an entire stripe width, can be done without read-modify-write cycles for each data plus parity block, by simply overwriting the parity block with the computed parity since the new data for each data block in the stripe is known in its entirety at the time of the write.

RAID 6 extends RAID 5 by adding an additional parity block; thus it uses block-level striping with two parity blocks distributed across all member disks. RAID 6 does not have a performance penalty for read operations, but it does have a performance penalty on write operations because of the overhead associated with parity calculations. Performance varies greatly depending on how RAID 6 is implemented. RAID 6 is no more space inefficient than RAID 5 with a hot spare drive when used with a small number of drives, but as arrays become bigger and have more drives, the loss in storage capacity becomes less important and the probability of data loss is greater. RAID 6 provides protection against data loss during an array rebuild, when a second drive is lost, a bad block read is encountered, or other drive loss.

Two different syndromes need to be computed in order to allow the loss of any two drives. One of them, P can be the simple XOR of the data across the stripes, as with RAID 5. A second, independent syndrome is computed using field theory. The Galois field GF(m) is introduced with $m=2^k$, where $$GF(m) \cong F_2[x]/p(x))$$

for a suitable irreducible polynomial p(x) of degree k. A chunk of data can be written as $d_{k-1}d_{k-2}\ldots d_0$ in base 2, where each $d_i$ is either 0 or 1. This is chosen to correspond with the element $d_{k-1}x^{k-1}+d_{k-2}x^{k-2}+\ldots +d_1x+d_0$ in the Galois field.

Let $D_0, \ldots, D_{n-1} \in GF(m)$ correspond to the stripes of data across hard drives encoded as field elements in this manner (in practice they would probably be broken into byte-sized chunks). If g is some generator of the field and $\oplus$ denotes addition in the field while concatenation denotes multiplication, then P and Q may be computed as follows (n denotes the number of data disks):

$$P = \bigoplus_i D_i = D_0 \oplus D_1 \oplus D_2 \oplus \ldots \oplus D_{n-1}$$

-continued
$$Q = \bigoplus_i g^i D_i = g^0 D_0 \oplus g^1 D_1 \oplus g^2 D_2 \oplus \ldots \oplus g^{n-1} D_{n-1}$$

$\oplus$ is a bitwise XOR operator and $g^i$ is the action of a linear feedback shift register on a chunk of data. Thus, the calculation of P is just the XOR of each stripe. This is because addition in any characteristic two finite fields reduces to the XOR operation.

The computation of Q is the XOR of a shifted version of each stripe. Mathematically, the generator is an element of the field such that $g^i$ is different for each nonnegative i satisfying i<n.

If one data drive is lost, the data can be recomputed solely from P, and therefore the implementation is similar to RAID 5. If two data drives are lost or the drive containing P is lost, the data can be recovered from Q (and P, if available) using a more complex process.

Suppose that $D_i$ and $D_j$ are the lost values with i≠j. Using the other values of D, constants A and B may be found so that $D_i \oplus D_j = A$ and $g^i D_i \oplus g^j D_j = B$. Multiplying both sides of the latter equation by $g^{n-i}$ and adding to the former equation yields $(g^{n-i+j} \oplus 1)D_j = g^{n-i}B \oplus A$ and thus a solution for $D_j$ which may be used to compute $D_i$. The computation of Q is computationally intensive compared with P.

A number of algorithms for computing Q in a RAID 6 implementation are known. Reed-Solomon codes have a strip unit which is a w-bit word, where w must be large enough that $n \leq 2^w \oplus 1$. w is typically constrained so that words fall on machine word boundaries: $w \in \{8, 16, 32, 64\}$. However, as long as $n \leq 2^w + 1$, the value of w may be chosen at the discretion of the user. Most implementations choose w=8, since their systems contain fewer than 256 disks. Reed-Solomon codes treat each word as a number between 0 and $2^w - 1$, and operate on these numbers with Galois Field arithmetic (GF($2^w$)). The act of encoding with Reed-Solomon codes is simple linear algebra. A Generator Matrix is constructed from a Vandermonde matrix, and this matrix is multiplied by the k data words to create a codeword composed of the k data and m coding words. When disks fail, the lost data may be reconstructed by deleting rows of $G^T$, inverting it, and multiplying the inverse by the surviving words. This process is equivalent to solving a set of independent linear equations. The construction of $G^T$ from the Vandermonde matrix ensures that the matrix inversion is always successful.

CRS codes modify RS codes in two ways. First, they employ a different construction of the Generator matrix using Cauchy matrices instead of Vandermonde matrices. Second, they eliminate the expensive multiplications of RS codes by converting them to extra XOR operations. Note, this second modification, which transforms $G^T$ from a n*k matrix of w-bit words to a wn*wk matrix of bits, can only apply to Vandermonde-based RS codes. As with RS coding, w must be selected so that $n \leq 2^w + 1$. Instead of operating on single words, CRS coding operates on entire strips. In particular, strips are partitioned into w packets, and these packets may be large. The act of coding now involves only XOR operations—a coding packet is constructed as the XOR of all data packets that have a one bit in the coding packet's row of $G^T$. To make XORs efficient, the packet size must be a multiple of the machine's word size. The strip size is therefore equal to w times the packet size. Since w no longer relates to the machine word sizes, w is not constrained to [8,16,32,64]; instead, any value of w may be selected as long as $n \leq 2^w$. Decoding in CRS is analogous to RS coding, in which all rows of $G^T$ corresponding to failed packets are deleted, and the matrix is inverted and employed to recalculate the lost data.

EVENODD and RDP are two codes developed for the special case of RAID-6, which is when m=2. Although their original specifications use different terms, EVENODD and RDP fit the same paradigm as CRS coding, with strips being composed of w packets. In EVENODD, w is constrained such that k+1≦w and w+1 is a prime number. In RDP, w+1 must be prime and k≦w. Both codes perform the best when (w−k) is minimized. In particular, RDP achieves optimal encoding and decoding performance of (k−1) XOR operations per coding word when k=w or k+1=w. Both codes' performance decreases as (w−k) increases.

If we encode using a Generator bit-matrix for RAID-6, the matrix is quite constrained. In particular, the first kw rows of $G^T$ compose an identity matrix, and in order for the P drive to be straight parity, the next w rows must contain k identity matrices. The only flexibility in a RAID-6 specification is the composition of the last w rows. In, Blaum and Roth demonstrate that when k≦w, these remaining w rows must have at least kw+k−1 ones for the code to be MDS. We term MDS matrices that achieve this lower bound Minimal Density codes.

REFERENCES

Each of the following references is expressly incorporated herein by reference

[1] M. Blaum, J. Brady, J. Bruck, and J. Menon. "EVENODD: An Efficient Scheme for Tolerating Double Disk Failures in RAID Architectures," IEEE Transactions on Computers (44:2), 1995, pp. 192-202.

[2] M. Blaum, P. Farrell, and H. van Tilborg, "Array Codes," Handbook of Coding Theory, V. S. Pless and W. C. Huffman, eds., Elsevier Science Publishers B.V., 1998.

[3] P. Corbett, B. English, A. Goel, T. Grcanac, S. Kleiman, J. Leong, and S. Sankar, "Row-Diagonal Parity for Double Disk Failure Correction", Proc. of USENIX FAST 2004, Mar. 31 to Apr. 2, San Francisco, Calif., USA.

[4] J. Feng, Y. Chen, and D. Summerville, "A Survey on the Application of the XOR Erasure Code for Distributed Storage System," submitted to the IEEE Communications Surveys and Tutorial, February 2010, under review.

[5] C. Jin, H. Jiang, D. Feng and L. Tian, "P-Code: A New RAID-6 code with optimal properties," 23rd International Conference on Supercomputing, New York, June, 2009, CSE Conference and Workshop Papers, University of Nebraska (2009), digitalcommons.unl.edu/cgi/viewcontent.cgi?article=1154&context=cseconfwork&sei-redir=1#search="raid-6".

[6] J. S. Plank, "A Tutorial on Reed-Solomon Coding for Fault-Tolerance in RAID-like Systems," Software: Practice and Experience, vol. 27, no. 9, pp. 995-1012, January 1999.

[7] J. S. Plank, "The RAID-6 Liberation Codes," the 6th USENIX Conference on File and Storage Technologies (FAST '08), pp. 97-110, San Jose, Calif., February, 2008.

[8] J. S. Plank, J. Luo, C. Schuman, L. Xu, and Z. Wilcox-O'Hearn, "A Performance Evaluation and Examination of Open-Source Erasure Coding Library for Storage," the 7th USENIX Conference on File and Storage Technologies (FAST '09), San Francisco, Calif., February, 2009.

[9] M. Rabin, "Efficient Dispersal of Information for Security, Load Balancing and Fault Tolerance", J. ACM, 32(4), 335-348, April 1989.

[10] G. Wang, X. Liu, S. Lin, G. Xie and J. Liu, "Generalizing RDP Codes Using the Combinatorial Method," the 7th IEEE International Symposium on Network Computing Applications (NCA-08), Cambridge, Mass., 2008.

[11] L. Xu and J. Bruck. "X-Code: MDS Array Codes with Optimal Encoding," IEEE Trans. on Information Theory (45), 1999, pp. 272—276.

[12] D. Bindel, Y. Chen, P. Eaton, D. Geels, R. Gummadi, S. Rhea, H. Weatherspoon, W. Weimer, C. Wells, B. Zhao, and J. Kubiatowicz, "Oceanstore: An extremely wide-area storage system," in Proceedings of the 9th International Conference on Architectural Support for Programming Languages and Operating Systems, pages 190-201, 2000

[13] M. Blaum and J. Bruck, "MDS array codes with independent parity symbols," IEEE Transactions on Information Theory, pp. 529-542, 1996.

[14] M. Blaum and R. Roth, "New array codes for multiple phased burst correction," IEEE Transactions on Information Theory, pp. 66-77, 1993.

[15] J. Blimer, M. Kalfane, R. Karp, M. Karpinski, M. Luby, and D. Zuckerman, "An XOR-Based Erasure-Resilient Coding Scheme," Technical report, The International Computer Science Institute (ICSI), 1995

[16] Y. Cassuto, "Coding Techniques for Symbol-Storage Systems," Ph. D. Dissertation, California Institute of Technology, 2008.

[17] Y. Cassuto and J. Bruck, "Cyclic low density MDS array codes," in proceedings of the 2006 IEEE International Symposium on Information Theory, pp. 2794-2798, Seattle, Wash., U.S.A., July 2006

[18] A. G. Dimakis, V. Prabhakaran, and K. Ramchandran, "Decentralized erasure codes for distributed networked storage," IEEE Transaction on Information Theory, vol 52, no 14, pp 2809-$2^8$16, 2006,

[19] J. L. Fan, "Array codes as low-density parity-check codes," the 2nd International Symposium on Turbo Codes & Related Topics, 2000, pp. 543-546.

[20] G. L. Feng, R. H. Deng, F. Bao, and J. C. Shen, "New Efficient MDS Array Codes for RAID Part I: Reed-Solomon-Like Codes for Tolerating Three Disk Failures," IEEE Transactions on Computers, pp. 1071-1080, 2005.

[21] G. L. Feng, R. H. Deng, F. Bao, and J. C. Shen, "New Efficient MDS Array Codes for RAID Part II: Rabin-Like Codes for Tolerating Multiple (greater than or equal to 4) Disk Failures," IEEE Transactions on Computers, pp 1473-1483, 2005.

[22] J. Feng, Y. Chen, and D. Summerville, "EEO: an Efficient MDS-Like RAID-6 Code for Parallel Implementation", IEEE Sarnoff 2010, Princeton, N.J., Apr. 11-13, 2010.

[23] B. Gaidioz, B. Koblitz, and N. Santos, "Exploring high performance distributed file storage using LDPC codes," ACM Parallel Computing, pp. 264-274, 2007.

[24] K. Greenan, E. L. Miller, and T. Schwarz, "Analysis and construction of Galois fields for efficient storage reliability," Technical Report UCSC-SSRC-07-09, University of California, Santa Cruz, 2007.

[25] J. L. Hafner, "WEAVER Codes: Highly Fault Tolerant Erasure Codes for Storage Systems," the Fourth USENIX Conference on File and Storage Technologies (FAST '05)', pp. 211-224, 2005.

[26] J. L. Hafner, "HOVER Erasure codes for disk arrays" IBM Research Report, RJ10352 (A0507-015) Jul. 12, 2005.

[27] L. Hellerstein, G. A. Gibson, R. M. Karp, R. H. Katz, and D. A. Patterson, "Coding techniques for handling failures in large disk arrays," Algorithmica, pp. 182-208, 1994.

[28] C. Huang, J. Li, and M. Chen, "On Optimizing XOR-Based Codes for Fault-Tolerant Storage Applications," the 2007 IEEE Information Theory Workshop, ITW '07, pp. 218-223 2007.

[29] C. Huang and L. H. Xu, "STAR: An Efficient Coding Scheme for Correcting Triple Storage Node Failures," IEEE Transactions on Computers, pp. 889-901, 2008.

[30] C. Huang, M. H. Chen, and J. Li, "Pyramid codes: Flexible schemes to trade space for access efficiency in reliable data storage systems," in NCA-07: 6th IEEE International Symposium on Network Computing Applications, Cambridge, Mass., July 2007.

[31] R. Katti and X. Y. Ruan, "S-code: new distance-3 MDS array codes," the IEEE International Symposium on Circuits and Systems, 2005. (ISCAS 2005.), pp. 23-26, 2005.

[32] J. Kempf, "Erasure Coding for the Software Engineer: A Case Study," Technical report, Rensselaer Polytechnic Institute, 2007.

[33] J. Kurihara, S. Kiyomoto, K. Fukushima, and T. Tanaka, "A New (k,n)-Threshold Secret Sharing Scheme and Its Extension," ISC '08: Proceedings of the 11th international conference on Information Security, Springer-Verlag, Berlin, Heidelberg, pp. 455-470, 2008.

[34] E. Louidor and R. M. Roth, "Lowest Density MDS Codes Over Extension Alphabets," IEEE Transactions on Information Theory, pp. 3186-3197, 2006.

[35] M. G. Luby, M. Mitzenmacher, M. A. Shokrollahi, and D. A. Spielman, "Efficient erasure correcting codes," IEEE Transactions on Information Theory, pp. 569-584, 2001.

[36] M. G. Luby., M. Mitzenmacher, M. A. Shokrollahi, D. A. Spielman, and V. Stemann, "Practical loss-resilient codes," in Proceedings of the 29th annual ACM symposium on Theory of computing, (STOC '97), New York, N.Y., USA, pp. 150-159, 1997.

[37] J. Luo, L. Xu, and J. S. Plank, "An Efficient XOR-Scheduling Algorithm for Erasure Codes Encoding," the IEEE International Conference on Dependable Systems and Networks (DSN-2009), Lisbon, Portugal, 2009.

[38] F. J. Macwilliams and N. J. A. Sloane, "The Theory of Error-Correcting Codes," North-Holland Publishing Company, Amsterdam, New York, Oxford, 1977.

[39] D. Patterson, G. Gibson, and R. Katz, "A case for redundant arrays of inexpensive disks (RAID)," in ACM SIG-MOD, pp. 109-116, June 1988.

[40] E. Pinheiro, W.-D. Weber, and L. A. Barroso, "Failure Trends in a Large Disk Drive Population," in Proceedings of the 6th USENIX Conference on File and Storage Technologies (FAST '07), San Jose, Calif., February 2007

[41] J. S. Plank, "Enumeration of Small, Optimal and Near-Optimal Parity-Check Erasure Codes," Technical report, Department of Computer Science, University of Tennessee, (UT-CS-04-535), 2004.

[42] J. S. Plank. "Erasure Codes for Storage Applications," Tutorial, 4th Usenix Conference on File and Storage Technologies (FAST-2005), San Francisco, Calif., December, 2005.

[43] J. S. Plank and L. Xu, "Optimizing Cauchy Reed-Solomon Codes for Fault-Tolerant Network Storage Applications," the 5th IEEE International Symposium on Network Computing and Applications (IEEE NCA06), Cambridge, Mass., July, 2006, pp 173-180.

[44] I. S. Reed and G. Solomon, "Polynomial codes over certain finite fields," Journal of the Society for Industrial and Applied Mathematics, pp. 300-304, 1960.

[45] B. Schroeder and G. A. Gibson, "Disk Failures in the Real World: What Does an MTTF of 1,000,000 Hours Mean to You?" in Proceedings of the 6th USENIX Conference on File and Storage Technologies (FAST '07), San Jose, Calif., February 2007.

[46] M. Woitaszek, "Tornado Codes for Archival Storage," Ph.D. Dissertation, University of Colorado, Boulder, 2007.

[47] S. Mishra, S, Vemulapalli, P. Mohapatra, "Dual-Crosshatch Disk Array" A Highly Reliable Hybrid-RAID Architecture", Proceedings of the 1995 International Conference on Parallel Processing, CRC Press, 1995.

[48] X. Liu, G. Wang, J. Liu, "A Research on Multi-Level Networked RAID Based on Cluster Architecture," ica3 pp, pp. 0226, Fifth International Conference on Algorithms and Architectures for Parallel Processing (ICA3PP '02), 2002.

[49] Anvin, H. Peter (21 May 2009). "The mathematics of RAID-6". http://ftp.kernel.org/pub/linux/kernel/people/hpa/raid6.pdf.

[50] Plank, James S., "A New Minimum Density RAID-6 Code with a Word Size of Eight", Technical Report CS-08-612, www.cs.utk.edu/-plank/plank/papers/CS-08-612.html.

The following US Patents and patent applications are expressly incorporated herein by reference: U.S. Pat. Nos. 7,577,866; 7,694,170; 7,689,877; 7,669,107; 7,664,915; 7,653,783; 7,644,308; 7,644,303; 7,634,686; 7,613,945; 7,610,506; 7,607,068; 7,596,673; 7,594,075; 7,577,897; 7,577,866; 7,574,622; 7,562,188; 7,529,970; 7,519,629; 7,512,862; 7,506,187; 7,499,980; 7,493,514; 7,493,370; 7,487,394; 7,480,827; 7,475,189; 7,472,298; 7,467,281; 7,451,467; 7,441,146; 7,434,096; 7,430,635; 7,426,611; 7,421,520; 7,418,550; 7,406,621; 7,404,102; 7,398,418; 7,392,458; 7,392,428; 7,353,423; 7,318,190; 7,310,745; 7,290,199; 7,237,062; 7,219,289; 7,194,579; 7,188,303; 7,103,824; 7,007,193; 6,950,901; 6,862,609; 6,823,425; 6,795,895; 6,769,088; 6,754,434; 6,718,436; 6,678,768; 6,574,745; 6,571,349; 6,567,926; 6,557,114; 6,532,548; 6,502,166; 6,449,730; 6,385,392; 6,378,038; 6,304,941; 6,282,671; 6,282,670; 6,282,619; 6,223,251; 6,195,727; 6,151,685; 6,148,430; 6,101,615; 6,092,215; 6,058,455; 6,029,257; 5,996,089; 5,950,230; 5,862,312; 5,812,753; 5,499,253; 20110055472; 20100235677; 20100217752; 20100115335; 20100083069; 20100083068; 20100050015; 20100083247; 20100050013; 20100049735; 20100017650; 20100017649; 20100017556; 20100017456; 20090319869; 20090313499; 20090300412; 20090296540; 20090292861; 20090271657; 20090228648; 20090216832; 20090199026; 20090172464; 20090172277; 20090172273; 20090138755; 20090138656; 20090132617; 20090106602; 20090106491; 20090089612; 20090089504; 20090083481; 20090077547; 20090077333; 20090055688; 20090055682; 20090055585; 20090055584; 20090055401; 20090044075; 20090041164; 20090006900; 20090006886; 20090006804; 20090006740; 20080320097; 20080301366; 20080276152; 20080276057; 20080276041; 20080275928; 20080250270; 20080243743; 20080229155; 20080229148; 20080201608; 20080184067; 20080177815; 20080162806; 20080155194; 20080148025; 20080109616; 20080109601; 20080104444; 20080091877; 20080059865; 20080046648; 20080040646; 20080040542; 20080040416; 20080040415; 20080034157; 20080022156; 20080022150; 20080010502; 20080005612; 20080005478; 20080005464; 20080005385; 20070234111; 20070234110; 20070234109; 20070214194; 20070208839; 20070208790; 20070198889; 20070180306; 20070180298; 20070180297; 20070180296; 20070180295; 20070136525; 20070106925; 20070100913; 20070079068; 20070055905; 20070050544; 20070028145; 20070028136; 20070028044; 20070028042; 20060288161; 20060282700; 20060230317; 20060206662; 20060200626; 20060168398; 20060129876; 20060129873; 20060123312; 20060123271; 20060123270; 20060123269; 20060123268; 20060112032; 20060085594; 20060085593; 20060075290; 20060074995; 20060041619; 20060007576; 20050283646; 20050278612; 20050240804; 20050240725; 20050229023; 20050223156; 20050166017; 20050160307; 20050108776; 20050060477; 20050055603; 20050050381; 20040123223; 20040078643; 20040015986; 20030191983; 20030070043; 20030041211; 20030023811; 20020138784; 20020091897; 20020076197; 20020059540; 20020013916; and 20010013104.

DEFINITIONS

Assume that there are n symbols in the input symbol (we can call them as n information symbols and denoted as d), and outputs are n+r symbols, where r is the number of redundant/parity symbols that are generated by the erasure codes and denoted as c.

Symbol: the fundamental unit, normally it is a unit of a stored data or a parity. In practice, it could be a disk or a disk sector; it also could be a byte or a bit in one code. However, it does not imply that the symbols are necessarily binary.

Chain: a chain is a set of data symbols and parity symbols that are completely connected, and they are interdependently related according to parity computation relations.

Container: it is a virtual storage medium that contains all symbols belonging to one column of the array, normally it is a disk.

Optimal Erasure Code: it is such type of code that the lost original data symbol can be recovered from any k subset of the n datasets. Optimal Code is also known as Maximum Distance Separable (MDS) Code.

Non-Optimal Erasure Code: the original symbol can only be recovered from n+e subset of the n+r datasets, where e is the extra redundant symbols needed to retrieve from the chain.

Systematic Erasure Code: in this type of coding scheme the first n output code symbols are the original n input information symbols.

Non-Systematic Erasure Code: all the code schemes that are not in the systematic code category.

Update Complexity: this metrics is defined as the average number of parity symbols affected by a change of an individual information symbol in the codes.

Storage Efficiency: it is the ratio of information symbols among the whole symbol set, and normally it is the ratio of k/n.

Regular Structure: the code has regular structure that the coding and decoding procedure can be expressed as a clear equation. The regularity makes it easy to be implemented.

Irregular Structure: there is no clear equation to describe coding or decoding algorithms. However, it is possible to achieve better performances in these procedures.

Array Codes: it is one type of two dimensional codes, in which the parity check equations are given by XOR operations over lines in one or more directions. In fact, all the XOR erasure codes can be viewed as a family of array codes.

Horizontal Code: in this type of code scheme, each symbol of the chain is located in the different containers.

Vertical Code: in contrast to the horizontal code, in vertical code all the information symbols and the redundant symbols that belong to a chain coexist in the same column and are stored in one container.

Out-degree: the number of parity symbols to which an information symbol contributes.

In-degree: the number of information symbols that are involved in computing a parity symbol. Since all erasure codes operate on the ring or finite field, for convenience, we define $<m>n=j$ if and only if $j=m$ mod n and $0 \leq j \leq n-1$. For instance, $<7>5=2$ and $<-2>5=3$. For short, we will use $<m>$ in the place of $<m>n$ or m directly when there is no confusion.

SUMMARY OF THE INVENTION

In practice, data symbols are more important than parity symbols and users typically care more about how fast failed data symbols can be recovered in the decoding scheme than how fast the parity symbols can be constructed. With the emergence of the multi-core processor and programmable hardware implementation, the performance of the decoding algorithm can be improved significantly if some of operations can be processed in parallel. Most of the codes for RAID-6, such as EVENODD and RDP, can start two iterative decoding procedures when there is only one failed symbol in the chain with slope 1. However, faster decoding can be achieved.

The reason that codes based on XOR operation can start two decoding chains simultaneously is that one of the coding slopes includes an imaginary symbol to generate the parity, which leads to only one real symbol and one imaginary symbol erased on a specific chain and is used to start the chain. This leads to the question of whether speedup can be achieved in the parallel decoding process if both the coding slopes have the imaginary symbol.

The EEO (Extension of the EVENODD code) code scheme, which is an efficient MDS array-like scheme with optimal decoding at the cost of adding only two parity symbols on the parity devices, provides advantageous performance in a RAID implementation. The EEO code can be effectively implemented in parallel to accelerate the decoding procedure using multiple threads. Any two failed columns can be recovered. It is not strictly an MDS code, due to the two extra redundant symbols. However, it possesses the similar properties of the MDS code when applied to RAID-6.

It is therefore an object to provide a system and method for decoding a parity-encoded data set, comprising: receiving a chain of parity-encoded information having a plurality of information symbols and a plurality of parity symbols into at least one memory, each parity symbol being dependent on at least a portion of an original set of information symbols and each data symbol of the original set of data symbols contributing to a plurality of an original set of parity symbols, according to a parity algorithm, the plurality of data symbols and plurality of parity symbols being received from different containers; processing the received parity encoded data set using a plurality of processing threads of an automated processor system, each thread being allocated a distinct portion of a parity-checking processing task to cover a predefined portion of the parity encoding space, less than the entirety, with respect to each parity symbol, to determine a parity consistency of the received parity encoded data set; generating an indicia of whether there is parity consistency.

It is also an object to provide a system and method for encoding a parity-encoded data set, comprising: receiving a plurality of information symbols $d_t$; calculating a plurality of parity symbols $c_{i,0}, c_{i,1}, \ldots c_{i,n}$ using a parity algorithm based on the information symbols $d_t$, where $i=0, 1, \ldots, n-2$, using:

$$c_{i,0} = \bigoplus_{t=0}^{n-2} d_{t,t-i}, \text{ and } c_{i,1} = \bigoplus_{t=0}^{n-2} d_{t,i-t}; \text{ and}$$

storing the plurality of parity symbols and plurality of information symbols in different containers.

The method may further comprise processing the received parity-encoded data set to determine parity consistency, correcting at least one error in the plurality of information symbols and/or processing the received parity-encoded data set to correct at least two errors in the plurality of information symbols.

It is a still further object to provide system adapted to decode a parity-encoded data set, comprising: a memory adapted to store a chain of parity-encoded information having a plurality of information symbols and a plurality of parity symbols, each parity symbol being dependent on at least a portion of an original set of information symbols and each data symbol of the original set of data symbols contributing to a plurality of an original set of parity symbols, according to a parity algorithm, the plurality of data symbols and plurality of parity symbols being received from different containers; an automated data processor system adapted to process the received parity encoded data set using a plurality of processing threads, each thread being allocated a distinct portion of a parity-checking processing task to cover a predefined portion of the parity encoding space, less than the entirety, with respect to each parity symbol, to determine a parity consistency of the received parity encoded data set; and an output from the automated data processor system adapted to generate an indicia of whether there is parity consistency.

Another object provides a system adapted to encode a parity-encoded data set, comprising: at least one memory location adapted to store a plurality of information symbols $d_t$; an automated processor system adapted to calculate a plurality of parity symbols $c_{i,0}, c_{i,1}, \ldots c_{i,n}$ using a parity algorithm based on the information symbols $d_t$, where $i=0, 1, \ldots, n-2$, using:

$$c_{i,0} = \bigoplus_{t=0}^{n-2} d_{t,t-i}, \text{ and } c_{i,1} = \bigoplus_{t=0}^{n-2} d_{t,i-t}; \text{ and}$$

at least one memory location adapted to store the plurality of parity symbols and plurality of information symbols.

The plurality of parity symbols may comprise two parity symbols for each respective information symbol. Each parity symbol may be processed using two concurrent processing threads. The plurality of processing threads may be employed to recover erased information symbols, through computation of:

$\{(2mk,i),((2k+1)m,j), \ldots \},$ $\{(-2(k+1)m,i),-2mk,j), \ldots \},$ $\{(2mk,j),((2k+1)m,i), \ldots \},$ and $\{(-2(k+1)m,j),-2mk,i), \ldots \},$ wherein n is a number of rows of a data matrix, $0 \leq k \leq (n-1)$, and i and j are columns in which the data symbols are erased, and $m=j-i$.

The automated processor system may comprise a plurality of central processing units, each executing at least one processing thread.

The plurality of parity symbols $c_{i,0}, c_{i,1}, \ldots c_{i,n}$ may be generated using the parity algorithm based on the information symbols $d_t$, where $i=0, 1, \ldots, n-2$, using:

$$c_{i,0} = \bigoplus_{t=0}^{n-2} d_{t,t-i}, \text{ and } c_{i,1} = \bigoplus_{t=0}^{n-2} d_{t,i-t}.$$

A plurality of processing threads of an automated processor system may be used, each thread being allocated a distinct portion of a parity-checking processing task to cover a predefined portion of the parity encoding space, less than the entirety, with respect to each parity symbol, to determine a parity consistency of the received parity encoded data set.

The automated data processing system may be used to compute, each using a different processing thread:

$$\{(2mk,i),((2k+1)m,j), \ldots\},$$

$$\{(-2(k+1)m,i),-2mk,j), \ldots\},$$

$$\{(2mk,j),((2k+1)m,i), \ldots\}, \text{and}$$

$$\{(-2(k+1)m,j),-2mk,i), \ldots\},$$

to recover erased information symbols, wherein n is a number of rows of a data matrix, $0 \leq k \leq (n-1)$, and i and j are column in which the data symbols are erased, and $m=j-i$.

Each thread may execute using the same or a different arithmetic logic unit, and a plurality of threads may execute concurrently. Preferably, there are two parity columns, and four threads are executed concurrently (two for each parity column) to process the parity information to recover erased columns.

The plurality of information symbols $d_t$ may comprise a table of (n−1) rows and n columns, wherein n is prime, further comprising recovering from erasures in the i-th and j-th columns where $0 \leq i < j \leq n-1$, by commencing an iterative chain starting from imaginary point (n−1, i) or (n−1, j) with slope −1 or 1 and then with slope 1 and −1 alternatively, to traverse the sequence pair (n−1−k×(2×(j−i)+1), j), (n−1−k×2×(j−i), i), where $0 \leq k \leq n-1$. Four iterative chains starting from (n−1, i) and (n−1,j) with slope 1 and slope −1 respectively and then with slope −1 and 1 alternatively may be employed to recover the erasures of the i-th and j-th columns. Each of the four iterative chains may execute in parallel in a separate processing thread using a respectively distinct arithmetic logic unit.

The method may be embodied in a computer readable medium storing therein instructions adapted to control an automated data processing system to perform the respective method. Likewise, a special purpose hardware device may be provided to implement the algorithms.

BRIEF DESCRIPTION OF THE DRAWINGS

FIG. 1A shows a data table having data symbols and parity symbols (n=5);

FIGS. 1B and 1C show that the same symbols construct the chains in $c_{i,0}$ and $c_{i,1}$, respectively;

DETAILED DESCRIPTION OF THE PREFERRED EMBODIMENTS

EEO Scheme

Figure 2A:
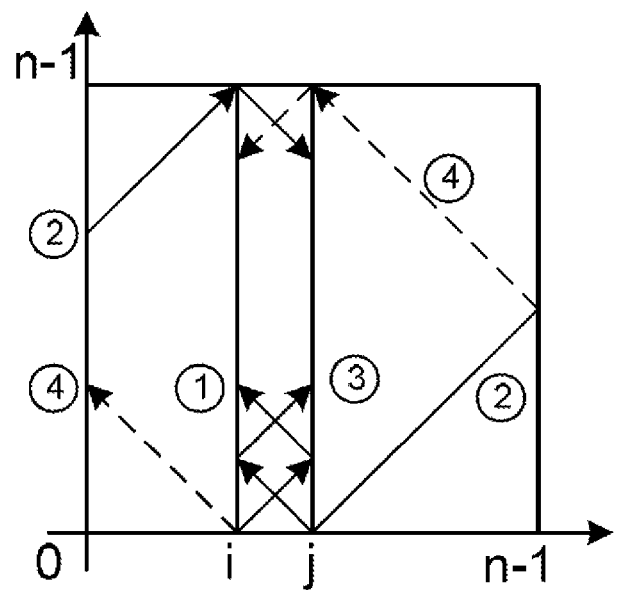
FIGS. 2A and 2B show illustrations of the decoding procedure with four chains.

The EEO scheme consists of (n−1) row×(n+2) column+2 symbols, where the first (n−1) rows×n columns contain information symbols and the last 2 columns contain parity symbols. Unlike other codes, the EEO scheme forbids the row parity and uses the extra two parity symbols to eliminate the generation and regeneration of S adjustor. The most important issue is that the two extra parity symbols accelerate the parallel decoding procedure dramatically.

Encoding Procedure

FIGS. 1A-1C illustrate the encoding procedure of the EEO. In FIG. 1A (an example of n=5), the first (n−1) rows×n columns contain the information symbols represented by '$d_{i,j}$', and the last 2 columns contain the parity symbols represented by '$c_{i,0}$', '$c_{i,1}$'. The last row in the first n columns represents the imaginary area that is used for comprehension. In FIG. 1A, $d_{4,0}, d_{4,1}, d_{4,2}, d_{4,3}$, and $d_{4,4}$ are imaginary symbols. FIG. 1B (Slope=−1, construction of parity column $c_{i,0}$) and 1C (Slope=1, construction of parity column $c_{i,1}$) show that the same symbols construct the chains with columns $c_{i,0}$ and $c_{i,1}$ respectively. The encoding algorithm of parity columns is represented as the following:

$$c_{i,0} = \bigoplus_{t=0}^{n-2} d_{t,t-i}, \tag{1}$$

and $$c_{i,1} = \bigoplus_{t=0}^{n-2} d_{t,i-t}. \tag{2}$$

where $i=0, 1, \ldots, n-2$.

EEO Decoding Description

This section focuses on proving how to recover two failed data columns since it is clear how to recover single data column. That is, the i-th and j-th column failed where $0 \leq i < j \leq n-1$.

Lemma 1: Assume that there are two columns i and j, where $0 \leq i < j \leq n-1$. The iterative chain starting from imaginary point (n−1, i) or (n−1, j) with slope −1 and then with slope 1 and −1 alternatively can traverse all the points in i-th and j-th columns until it reaches point (n−1, j) if and only if n is a prime number.

Proof:

First, we assume that n is a prime number. The imaginary row is included for convenience. Suppose the starting point is (n−1, i), the next point by slope −1 is (n−1−(j−i), j), then the point (n−1−2(j−i), i) by slope 1. Iteratively, the sequence pair (n−1−k×(2×(j−i)+1), j), (n−1−k×2×(j−i), i) where $0 \leq k \leq n-1$ can be derived.

The sequence has 2×n points, and each column has been hit n times. The sequence of points in the i-th column are (n−1−k×2×(j−i), i). The sequence points in the j-th column are (n−1−k×(2×(j−i)+1), j). Then proving the lemma is equivalent to proving that the sequence can traverse the i-th and j-th columns respectively.

Consider the i-th column, for example. The sequence can be simplified to (r−k×c), where r=n−1, c=2×(j−i), where $0 \leq k \leq n-1$. The proof of the lemma in i-th column is equivalent to proving that the sequence (r−k×c) does not repeat and it occurs only once where 0<c, r<n.

Suppose there are two integers x, y where $0 \leq x < y \leq n-1$ and make sequence (r−x×c)=(r−y×c). That is, there are two equal sequence numbers, and (x−y)×c mod n=0. As n is a prime number, c cannot be divided by n, then (x−y) should be divisible by n, which is contradicted with the fact that $0 \leq x < y \leq n-1$, and n is a prime number. Therefore, the sequence cannot repeat when $0 \leq k \leq n-1$, the iterative chain traverses the n symbols in the i-th column. Since (n−1−n×c, i) mod n=(n−1, i), the next point hits the starting point.

On the other hand, if n is not a prime number n can be factored into two factors: $n_1$ and $n_2$, where $n_1 < n$, and $n_2 < n$. Considering (x−y)×c mod n=0, if we make c=$n_1$ or $n_2$, then (x−y) is not required to be dividable by n and the equation is still valid, which implies that the sequence (r−k×c) could repeat when 0<c<n. There must be at least one symbol that cannot be reached by the iterative chain. Then n is a prime number is a necessary condition.

The sequence in the j-th column can be proved to traverse the n points in a similar manner. Then the lemma from (n−1, i) is proved. The starting point from (n−1, j) can be also be proven in a similar way. Lemma 1 is thus proven.

According to Lemma 1, from any starting point, the data symbols in two columns can be hit one by one. The two failed columns can be recovered from any starting point. Just like other XOR erasure codes, it is very simple to implement the iterative operation in software or hardware. It is clear that we can start recovery chains in parallel. Advantageously, these chains can be processed in parallel threads on a single CPU, executing on multiple CPUs (central processing units) (e.g., multiple cores) or embedded processors, distributed processors (e.g., cloud computing), using GPU (graphics processing units, e.g., single instruction multiple data (SIMD) processors), etc.

However, in RDP code, one of them stops quickly when it hit the missing chain, which leads to more steps to recover all lost symbols. Then before starting with four chains in EEO there are two questions to be answered: "Can the four iterative chains encounter in the middle and when?" and "What is the advantage of starting with four chains?"

Here, 'encounter' means that the next point the chain reaches has already been hit by another chain. Before deriving the conclusion, several lemmas are first proved.

Lemma 2. For two sequences, seq1=k×m mod n, seq2=k×(n−m) mod n, where $1 \leq k \leq n-1$, m=j−i, n is a prime number, seq2 is the reverse of sequence 1, and $seq1_k + seq2_k = n$, $seq1_k \neq seq2_k$.

Proof:
For seq1, $seq1_k = x = k \times m \mod n$, that is, $$k \times m = x + w \times n \quad (3)$$

Similarly, $seq2_k = y = k \times (n-m) \mod n$, that is, $$(k \times n - k \times m) \mod n = y + h \times n \quad (4)$$

where 0<x, y<n, and w, h, k are all integers. Substituting equation (3) into equation (4), we get
k×n−x−w×n=y+h×n, that is:

$$x + y = (k - w - h) \times n \quad (5)$$

where 0<x, y<n, 0<x+y<2×n, k−w−h is an integer.

Then we get x+y=n. That is, $seq1_k + seq2_k = n$.
The reverse of sequence 1 is:

$$Seq1_{n-k} = z = (n-k) \times m \mod n \quad (6)$$

and $$Seq2_k = y = (k \times n - k \times m) \mod n \quad (7)$$

Since k×n mod n=n×m mod n=0, by comparing equations (6) and (7), $Seq1_{n-k} = -k \times m = Seq2_k$. Therefore, sequence 2 is just the reverse of sequence 1. Without considering the order, seq1=seq2. If considering the order, we know $seq1_k + seq2_k = n$, the sequence is not repeated and n is odd number, it is easier to find that $seq1_k \neq seq2_k$. Therefore, Lemma2 is proven.

Example 1

Figure 4A:
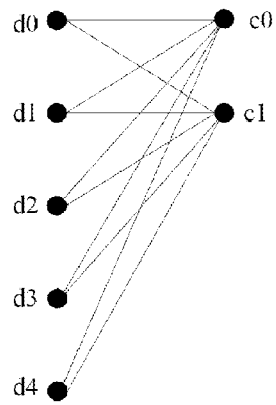
FIGS. 4A, 4B and 4C show illustrations representing the formation of parity symbols, and storage of parity-encoded information in horizontal (FIG. 4B) and vertical (FIG. 4C) storage codes.
Figure 4B:
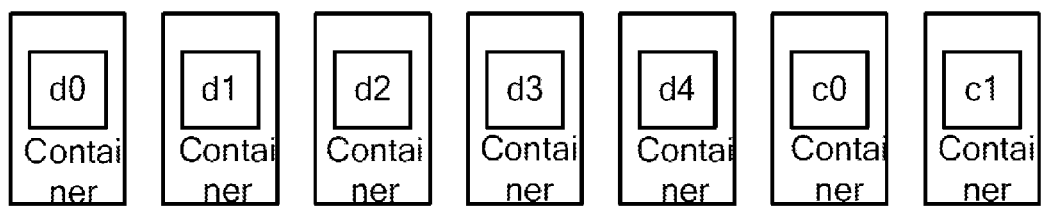

As shown in FIG. 4, let n=5, and r=2, the information symbols can be represented as d0, d1, d2, d3, d4, the redundant symbols are represented as c0 and c1. There are two chains: d0d1d2d3d4d5c0 and d0d1d2d3d4c1. If any two symbols are lost, the information symbols can be reconstructed, it is called optimal erasure code or MDS code. Otherwise, it is non-optimal erasure code.

If the beginning five symbols of output codes are d0d1d2d3d4, it is a systematic code, otherwise it is a non-systematic code. Since each information symbol contributes to two parity symbols, the update complexity/out-degree is 2. Since each parity symbols is connected to five information symbols, the in-degree is 5. The storage efficiency is 5/7.

Figure 4C:
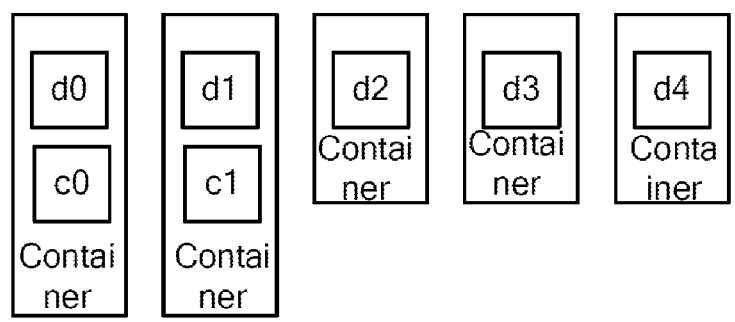

If the encoding and decoding method can be described explicitly using an equation, for example, the c0 is the XOR of all information symbols (see FIG. 4A), it is regular structure code; otherwise, it is non-regular. If more parity symbols can be added to tolerate the lost of more information symbols, for example, the r can be 20 or even more with the n increases; and when any r symbols are lost, the information symbols can be recovered, the code is said to be resilient; otherwise, the code is limited-tolerant. If the output code is placed as FIG. 4B, any disk can have either the parity or the information symbol, it is a horizontal code; otherwise, it is a vertical code as shown by FIG. 4C.

Although there were some other methods developed earlier for distributed fault tolerant symbol storage such as RAID-4 and RAID-5, EVENODD is the milestone that indicated the XOR method has been applied in the symbol storage area.

In EVENODD, the information symbols occupy n disks, where n is a prime number. The redundant symbols should be placed on the other two disks. The total disk number is n+2. For the sake of simplicity, we assume that there are only n−1 information symbols stored on the disks. The i-th symbol in the j-th disk is referred as $a_{ij}$, where 0<i<n−2, 0<j<n+1. The redundant symbols are stored in the last two disks. The EVENODD code scheme can be specified as follows: in an (n−1)×(n+2) array, compute the content of the redundant part based on the information symbols such that the information contained in any two erased disks can be reconstructed from the other n disks. The encoding algorithm of the EVENODD code solves the foregoing problem and requires only XOR operations for computing the redundancy.

Before formally describing the encoding procedure, the following assumptions are made. Suppose that there is an imaginary 0-row after the last row, i.e., $d_{n-1}$, j=0, 0<j<n−1.

With this assumption, the array is now an n×(n+2) array. Although this assumption is not necessary, it is useful.

$$\text{Let } S = \bigoplus_{t=1}^{n-1} d_{n-1-t,t},$$

For each row x, the redundant symbols are obtained according to the follows:

$$c_{t,0} = \bigoplus_{t=0}^{n-1} d_{x,t}, \text{ and } c_{t,1} = S \oplus \left(\bigoplus_{t=0}^{n-1} d_{x-t,t}\right).$$

As shown by the equations, two types of redundancy are obtained: horizontal redundancy and diagonal (slope=−1) redundancy. For the first redundant disk, it is simply the XOR of disks 0, 1, . . . , n−1. In fact, its contents are exactly the same as the parity contents of the parity disk in an equivalent RAID-5 array with one less disk.

The contents on the other redundant disk come from the diagonal redundancy calculated using the formula for $c_{t,1}$, which shows that the parity is determined by S. When S is 0, the parity is even parity check; when S is 1, the parity is odd parity check. Because of this parity check characteristics, this code scheme is named EVENODD code by the researchers.

The (n−1)×(n+2) array defined above can recover the information symbols lost in any two columns. Therefore, the minimum distance of the code is three. The encoding procedure is very simple and the implementation of the equations for $c_{0,t}$ and $c_{1,t}$ on top of digital circuits is straightforward. In a more general sense, we can implement the equations in the RAID controller using XOR hardware.

In order to decode the parity, we consider the (n−1)×(n+2) array of symbols such that the last two columns are redundant according to the parity encoding algorithm for $c_{0,t}$ and $c_{1,t}$. Assume that columns (disks) i and j are failed, where $0 \leq i < j \leq n+1$. Let's consider the following four scenarios:

1. i=n and j=n+1

Both the redundant disks have failed. Disk m can be reconstructed using $c_{0,t}$ and disk (n+1) can be reconstructed using $c_{1,t}$. In fact, the recovery procedure is equivalent to the encoding procedure.

2. i<n and j=n

One redundant disk and one symbol disk have failed. Disk i can be easily recovered as follows:

$$\text{Let } S = d_{i-1,n+1} \oplus \left(\bigoplus_{t=0}^{n-1} d_{i-y-1,x}\right),$$

where an−1, y=0, 0≤y≤n+1, then $$d_{k,i} = S \oplus d_{i-1,n+1} \oplus \left(\bigoplus_{y=0}^{n-1} d_{k+i-y,y}\right),$$

where 0≤k≤n−2. And dk, n, 0≤k≤n−2 can be obtained by the equation for $d_{k,i}$.

3. i<n and j=n+1

One redundant disk and one symbol disk have failed. We can recover disk i using the equation for $c_{0,t}$ and disk n+1 using S and $c_{1,t}$ once disk i has been reconstructed.

4. i<n and j<n

If both failed disks carry information and we cannot retrieve them using the parities separately as we did in the previous three cases. The information can be recovered through the following steps.

Assume that the imaginary row dn−1, y=0 for 0≤y≤n−1, the diagonal parity S is:

$$S = \left(\bigoplus_{x=0}^{n-2} c_{x,0}\right) \oplus \left(\bigoplus_{x=0}^{n-2} c_{x,1}\right),$$

where S actually is the XOR of the symbols in parity columns. Define the horizontal and diagonal syndromes are:

$$S_u^0 = \bigoplus_{\substack{x=0 \\ x \neq i,j}}^{n} d_{u,x}$$

and $$S_u^1 = S \oplus a_{u,n+1} \oplus \left(\bigoplus_{\substack{x=0 \\ x \neq i,j}}^{n-1} a_{u-x,x}\right),$$

where 0≤u≤n−1. Then, the symbols in columns i and j can be retrieved through the following steps:
  i) Initialization:
  Set S←−(j−i)−1, and dn−1, x←0 for 0≤x≤m−1
  ii) Calculate the symbol:

$$\text{Let } d_{s,j} \longleftarrow S_{j+s}^1 \oplus d_{s+(j-1),i}, \text{and}$$

$$d_{s,i} \longleftarrow S_s^0 \oplus d_{s,j}.$$

iii) Execute iteratively:
  Set S←S−(j−i),
  if S=n−1 then stop,
  else go to step ii).

Example 2

Suppose n=5, m=2, n−m=3, then starting from 0, seq1 is {2, 4, 1, 3}; and seq2 is {3, 1, 4, 2};

Lemma 3. For two sequences, seq1=k×m mod n, seq2=k×(n−m) mod n, where 1≤k≤n−1, m=j−i, n is a prime number, if they run with the same speed each sequence will cover the first half of the entire data set when they encounter (overlap). The union of the first half of the seq1 and seq2 is equal to seq1 or seq2 without repeating.

Proof:

According to Lemma 2, sequence 2 is merely the reverse of sequence 1. That is, $seq2_k$=$seq1_{(n-k)}$. Then the traces of sequences 1 and 2 can be seen as the trace of two points in one sequence moving towards each other from the opposite end. Since the number of sequence 1 or 2 is n−1, which is even and the speed is the same, then both points can cover the equal distance (the half of the sequence) when they encounter.

Assume the first halves of sequence 1 and sequence 2 are $seq1_k$ and $seq2_k$, where 1≤k≤(n−1)/2. Then n−(n−1)/2=(n+1)/2<n−k<n−1, since sequence 2 is just the reverse of sequence 1. That is, $seq2_k$=$seq1_{(n-k)}$, the first half of $seq2_k$ can be equal to the second half of $seq1_{(n-k)}$. Thus, $\{seq2_k|1 \leq k \leq (n-1)/2\}=\{seq1_m|(n+1)/2 \leq n \leq (n-1)\}$, therefore the union of the sequence set seq={seq1$_k$∪seq2$_k$,|1≦k≦(n−1)/2}={seq1$_k$|1≦k≦(n−1)/2}∪{seq1$_m$|(n+1)/2≦n≦(n−1)}={seq1$_k$|1≦k≦(n−1)}.

Lemma 2 indicates that seq1$_k$+seq2$_k$=n and n is odd number, it is easier to find that seq1$_k$≠seq2$_k$. If there are k repeating symbols in the first halves of seq1 and seq2, the size of the union is (n−1)/2+(n−1)/2−k=(n−1)−k, which contradicts the conclusion above. That is, the first halves of seq1 and seq2 have no repetition. Therefore, Lemma 3 is proven.

Theorem 1. Assume there are two columns i and j, where 0≦i<j≦n−1, The four iterative chains starting from (n−1, i) and (n−1,j) with slope 1 and slope −1 respectively and then with slope −1 and 1 alternatively in the same speed can each traverse ¼ of the lost symbols when they encounter. The union of four sequence chains traverses all the failed symbols and each of them traverse ¼ of the failed symbols. The decoding speed increases 4 times.

Proof:

Since (n−m) mod n=(−m) mod n, and there is no difference when starting as the original point from the left-bottom point or right-top point. For the sake of convenience, we will use them in the proof.

The four iterative chains can be illustrated in FIG. 2A, chain 1 and chain 2 start from slope 1 and chain 3 and chain 4 start from slope −1. Through calculation, the four chains sequences are:

$$\{(2mk,i),((2k+1)m,j),\ldots\}, \quad 1.$$

$$\{(-2(k+1)m,i),-2mk,j),\ldots\}, \quad 2.$$

$$\{(2mk,j),((2k+1)m,i),\ldots\}, \quad 3.$$

$$\{(-2(k+1)m,j),-2mk,i),\ldots\}, \quad 4.$$

where 0≦k≦(n−1).

Then the proof of Theorem 1 can be reformatted as the following question: can the four chains cover the two failed columns? According to Lemma 1, neither of the chains can traverse all the symbols in the two columns; they must encounter somewhere before hitting the imaginary row.

Meanwhile, in each step, chain 1 and chain 3, chain 2 and chain 4 have the same row with different columns. In other words, in each step chain 1 and chain 3 will never hit the same symbol and likewise with chain 2 and chain 4. We can then simplify the procedure by mapping the four chains into two sequences that iteratively traverse one column (i.e. the i-th column):

$$\{(2mk),((2k+1)m),\ldots\}; \text{and} \quad 1.$$

$$\{(-2(k+1)m),-2mk),\ldots\}, \quad 2.$$

The two sequences can be further reduced to {mk} and {−mk}, respectively. The two iterative chain sequences are with the step m and (n−m) respectively, where m=j−i.

According to Lemma 3, the union of two sequence chains traverses all the failed symbols and each of them traverses half of them. Then Theorem 1 is proved. Theorem 1 provides the answer to whether the four processing chains encounter in the middle, and thus whether parallelism in processing would be expected to improve latency (net processing speed). As for the advantage of starting with four chains, it always only takes (n−1)/2 steps to recover the failed symbols, since there is only two recover chains. It is the optimal decoding process.

Based on Theorem 1, the EEO decoding algorithm can be described as follows:

Decoding Algorithm:

Step 1. Set k=n−1, set the starting point with (k, i) and (k, j);

Step 2. Start the four chain sequences to find the next symbols;

Step 3. If the next symbol is not on the imaginary row or is not hit, Go to Step 2; Else exit.

Figure 2B:
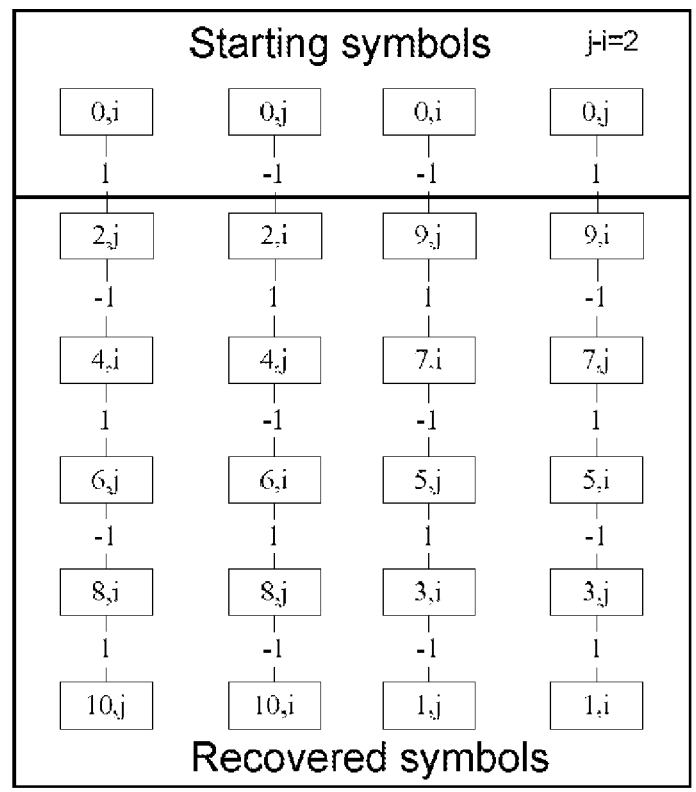

The operations of the algorithm are illustrated through an example. Assume that column i and j have failed where j−i=2, n=11. The decoding procedure is illustrated in FIG. 2B. According to Theorem 1, the iterative decoding process will continue until the four chains encounter in the middle, and each of them traverses ¼ of the failed symbols.

RAID-6 Properties

Theorem 2: EEO scheme is a RAID-6 scheme if and only if n is a prime number.

Proof:

First, by the coding scheme, we can see that all the parity symbols are stored in columns P and Q. Next we will prove that any two of the failed columns can be recovered.

According to Lemma 1, from any starting point, the data symbols in two columns can be hit one by one. Therefore, the two failed columns can be recovered. Theorem 2 is therefore proven.

Performance Analysis

Table 1 compares the properties of the EEO code and two other codes, EVENODD and RDP. The reason for choosing these two codes for comparison is that these two codes are the typical codes for RAID-6. Based on Table 1, if only XOR operations are considered, EEO does not possess much advantage over the other two codes. However, in practice, since information symbols are more important than the parity symbols, users typically care more about how fast the failed data symbols can be recovered in the decoding scheme than how fast the parity symbols can be constructed. The performance of reconstruction does not only depend on the XORs, but also on how many reconstructions can be conducted in parallel. This will reduce the time consumption dramatically.

TABLE 1

Normal Property Comparison

| | Coding | Decoding | Update | Storage |
|---|---|---|---|---|
| EVENODD | $2n^2 - 2n - 1$ | $2n^2 + 2n - 5$ | >2 | $n/(n + 2)$ |
| RDP | $2n^2 - 6n + 4$ | $2n^2 - 6n + 4$ | 2 | $(n - 1)/(n + 1)$ |
| EEO | $2n^2 - 2n$ | $2n^2 - 4n + 2$ | 2 | $n/((n + 2) + (2/(n - 1))$ |

Although all the XOR erasure codes can be efficiently implemented using hardware and/or software, the performance of the decoding procedure can be improved dramatically if it can be processed in parallel. For EVENODD, while one step is needed to recover S, in practice, it is not preferable to be implemented to recover all $S_u$ in n parallel procedures in one step. Thus, (n−1) steps with two parallel chains are needed to retrieve the failed symbols iteratively, since one of the slopes is 0 and the row parity chain cannot be started with two lost symbols. Therefore, ideally (n+1) steps are needed to recover the failed symbols.

RDP can only be processed in a single chain most of the time since the failed symbols can only be recovered one by one using the iterative algorithm. Even if it starts with two chains, one of them will stop quickly when it hits the missing chain. In contrast, the EEO code can start four chains in parallel and only (n−1)/2 steps are needed to recover the failed symbols.

Figure 3A:
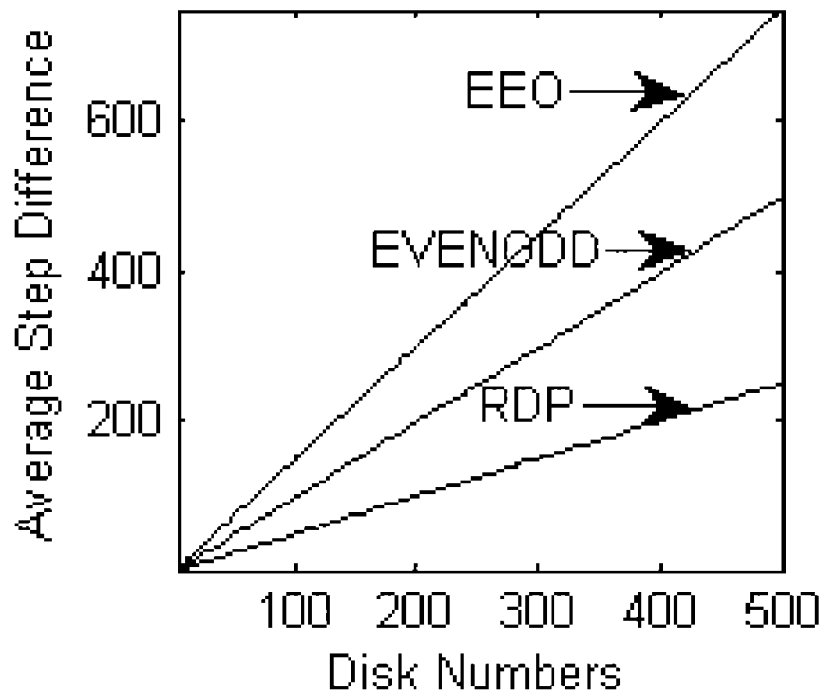
FIGS. 3A and 3B show graphs of the step difference and speedup, respectively, for the RDP, EVENODD, and EEO schemes, respectively.

FIG. 3A shows the average number of steps of the three code schemes with the same combination of two-failed columns ($C_{n-1}^2$), where the number of average steps is defined as the total number of maximum steps in each group chain. For example, for RDP, when n=5, there are six possible group chains, the two steps in each of them are (0,8), (0,8), (0,8), (2,6), (2,6), (4,4), the maximum step number in each is 8, 8, 8, 6, 6, 4. The average step number is (8+8+8+6+6+4)/6=40/6=6.67, and 2×(n−1)=8 steps are needed to recover all the failed symbols in one chain. Then the difference is (8−6.67)=1.33. In FIG. 3A, the difference among the number of average steps increases linearly with the growth of the disk number. The more the disks are adopted, the better the parallel performance of EEO.

Figure 3B:
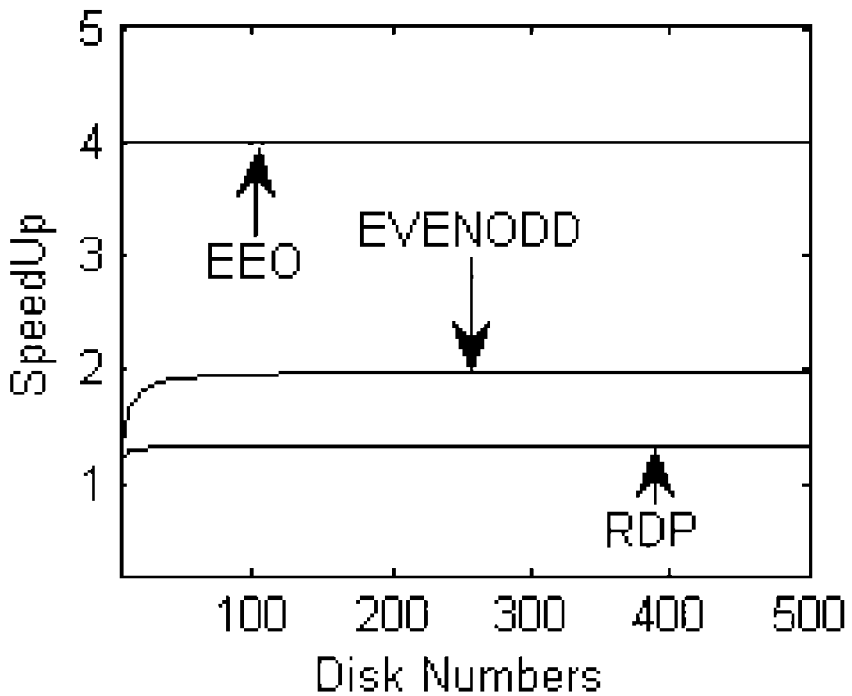

FIG. 3B shows a comparison of speedup among the three codes. The speedup is defined as the ratio of the number of steps needed to recover all the failed symbols in one chain to the total maximum number of steps in each XOR code. For example, in RDP, when n=5, the SpeedUp=6×2×(5−1)/(8+8+8+6+6+4)=48/40=1.2. That is, the speed can be improved by 120%. FIG. 3B also shows that speedup of the EEO code is stable at 400%, the EVENODD can be close to 200% and RDP is less than 150% in the simulation experiment using 500 disks based on parallel processing.

The EEO code, a new horizontal scheme, achieves the fastest decoding time among the reported erasure codes. The EEO code is actually an extension of the EVENODD code, and requires only (n−1)/2 iterative recovery steps in its decoding operations due to its four parallel iterative chains. The simplicity and flexibility of EEO make it easy to implement in hardware or parallel computing environments. The analysis of the parallel decoding procedure shows that the EEO code has achieved the highest efficiency in the decoding process compared with other horizontal MDS erasure codes for RAID-6. Although it requires two more sectors, the EEO code is very suitable for high availability in practical data storage systems.

Various aspects of the invention may be implemented using an automated processor, which may comprise a programmable logic device which receives a series of instructions stored on a medium readable by the programmable logic device, or a preprogrammed and/or fixed function logical device in which the functionality is established by persistent electronic elements.

The embodiments of the present invention may comprise general-purpose or special-purpose computer systems including various computer hardware components, which are discussed in greater detail below. Embodiments within the scope of the present invention also include computer-readable media for carrying or having computer-executable instructions, computer-readable instructions, or data structures stored thereon. Such computer-readable media may be any available media, which is accessible by a general-purpose or special-purpose computer system.

By way of example, and not limitation, such computer-readable media can comprise physical storage media such as RAM, ROM, EEPROM, CD-ROM, superconducting memory, or other optical disk storage, magnetic disk storage or other magnetic storage devices, or any other media which can be used to carry or store desired program code means in the form of computer-executable instructions, computer-readable instructions, or data structures and which may be accessed by a general-purpose or special-purpose computer system.

In this description, a "network" is defined as any architecture where two or more computer systems may exchange data with each other. When information is transferred or provided over a network or another communications connection (either hardwired, wireless, or a combination of hardwired or wireless) to a computer system or computer device, the connection is properly viewed as a computer-readable medium. Thus, any such connection is properly termed a computer-readable medium. Combinations of the above should also be included within the scope of computer-readable media. Computer-executable instructions comprise, for example, instructions and data which cause a general-purpose computer system or special-purpose computer system to perform a certain function or group of functions.

In this description and in the following claims, a "computer system" or "automated processor" or "automated processor system" is defined as one or more software modules, one or more hardware modules, or combinations thereof, that work together to perform operations on electronic data. For example, the definition of computer system includes the hardware components of a personal computer, as well as software modules, such as the operating system of the personal computer. The physical layout of the modules is generally not important, to the extent that the stated functions and capabilities are made available. A computer system may include one or more computers coupled via a computer network. Likewise, a computer system may include a single physical device where internal modules (such as a memory and processor) work together to perform operations on electronic data. Suitable processors for executing the erasure recovery algorithms disclosed herein include, but are not limited to, Intel quad core processors (e.g., i950), AMD quad core processors (e.g., Phenom), etc. Likewise, processors with more or fewer than four cores may also be employed, e.g., nVidia GPU processors (e.g., C1060 [Tesla], 9800), ATI GPU processors (e.g., 4650), etc., as well as newer Intel and AMD CPU devices.

Figure 5:
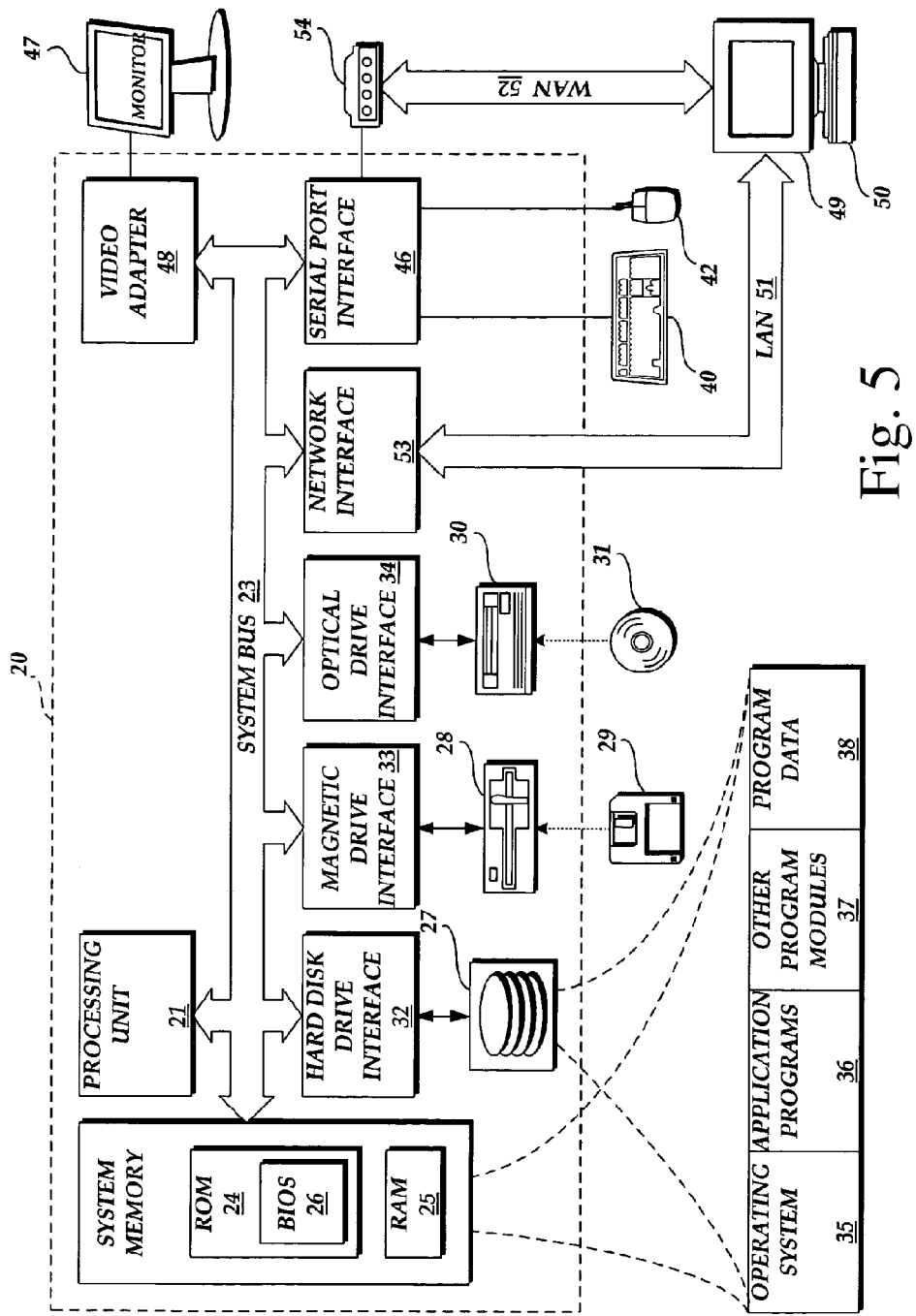
FIG. 5 shows a prior art computer system adapted to be used in conjunction with the present invention.

FIG. 5 and the following discussion are intended to provide a brief, general description of a generic computing environment in which aspects of the invention may be implemented. Generally, program modules executed by a personal computer include routines, programs, objects, components, data structures, etc. that perform particular tasks or implement particular abstract data types. Moreover, those skilled in the art will appreciate these may be practiced with other computer system configurations, including hand-held devices, multiprocessor systems, microprocessor-based or programmable consumer electronics, SIMD processors, MIMD processors, processor arrays, FPGAs, CPLDs, ASICs, network PCs, minicomputers, mainframe computers, and the like. The embodiments may also be practiced in distributed computing environments where tasks are performed by remote processing devices that are linked through a communications network. In a distributed computing environment, program modules may be located in both local and remote memory storage devices.

With reference to FIG. 5, a generic system for processing program instructions is shown which includes a general purpose computing device in the form of a conventional personal computer 20, including a processing unit 21, a system memory 22, and a system bus 23 that couples various system components including the system memory to the processing unit 21. The system bus 23 may be any of several types of bus structures including a memory bus or memory controller, a peripheral bus, and a local bus using any of a variety of bus architectures. The system memory includes read only memory (ROM) 24 and random access memory (RAM) 25. A basic input/output system 26 (BIOS) containing the basic routines that helps to transfer information between elements within the personal computer 20, such as during start-up, is stored in ROM 24. In one embodiment of the present invention on a server computer 20 with a remote client computer 49, commands are stored in system memory 22 and are executed by processing unit 21 for creating, sending, and using self-descriptive objects as messages over a message queuing network in accordance with the invention. The personal computer 20 further includes a hard disk drive 27 for reading from and writing to a hard disk, not shown, a magnetic disk drive 28 for reading from or writing to a removable magnetic disk 29, and an optical disk drive 30 for reading from or writing to a removable optical disk 31 such as a CD ROM or other optical media. The hard disk drive 27, magnetic disk drive 28, and optical disk drive 30 are connected to the system bus 23 by a hard disk drive interface 32, a magnetic disk drive interface 33, and an optical drive interface 34, respectively. The drives and their associated computer-readable media provide nonvolatile storage of computer readable instructions, data structures, program modules and other data for the personal computer 20. Although the exemplary environment described herein employs a hard disk, a removable magnetic disk 29 and a removable optical disk 31, it should be appreciated by those skilled in the art that other types of computer readable media which can store data that is accessible by a computer, such as flash memory, network storage systems, magnetic cassettes, random access memories (RAMs), read only memories (ROM), and the like, may also be used in the exemplary operating environment.

A number of program modules may be stored on the hard disk, magnetic disk 29, optical disk 31, ROM 24 or RAM 25, including an operating system 35, one or more application programs 36, other program modules 37, and program data 38. A user may enter commands and information into the personal computer 20 through input devices such as a keyboard 40 and pointing device 42. Other input devices (not shown) may include a microphone, joystick, game pad, satellite dish, scanner, or the like. These and other input devices are often connected to the processing unit 21 through a serial data interface 46 that is coupled to the system bus, but may be collected by other interfaces, such as a parallel port, game port or a universal serial bus (USB). A monitor 47 or other type of display device is also connected to the system bus 23 via an interface, such as a video adapter 48. In addition to the monitor, personal computers typically include other peripheral output devices (not shown), such as speakers and printers.

The personal computer 20 may operate in a networked environment using logical connections to one or more remote computers, such as a remote computer 49, through a packet data network interface to a packet switch data network. The remote computer 49 may be another personal computer, a server, a router, a network PC, a peer device or other common network node, and typically includes many or all of the elements described above relative to the personal computer 20, although only a memory storage device 50 has been illustrated in FIG. 5. The logical connections depicted in FIG. 5 include a local area network (LAN) 51 and a wide area network (WAN) 52. Such networking environments are commonplace in offices, enterprise-wide computer networks, intranets and the Internet.

When used in a LAN networking environment, the personal computer 20 is connected to the local network 51 through a network interface or adapter 53. When used in a WAN networking environment, the personal computer 20 typically includes a modem 54 or other elements for establishing communications over the wide area network 52, such as the Internet. The modem 54, which may be internal or external, is connected to the system bus 23 via the serial port interface 46. In a networked environment, program modules depicted relative to the personal computer 20, or portions thereof, may be stored in the remote memory storage device. It will be appreciated that the network connections shown are exemplary and other elements for establishing a communications link between the computers may be used.

Typically, a digital data stream from a superconducting digital electronic processing system may have a data rate which exceeds a capability of a room temperature processing system to handle. For example, complex (but not necessarily high data rate) calculations or user interface functions may be more efficiently executed on a general purpose computer than a specialized superconducting digital signal processing system. In that case, the data may be parallelized or decimated to provide a lower clock rate, while retaining essential information for downstream processing.

Throughout the specification the aim has been to describe the preferred embodiments of the invention without limiting the invention to any one embodiment or specific collection of features. Persons skilled in the relevant art may realize variations from the specific embodiments that will nonetheless fall within the scope of the invention. This specification should be interpreted as encompassing all combinations and subcombinations of features and features sets of the various aspects disclosed herein, including aspects disclosed as forming part of the prior art and those which are incorporated by reference from others.

What is claimed is:

1. A method for decoding a parity-encoded data set, comprising:
receiving a chain of parity-encoded information having a plurality of information symbols and a plurality of parity symbols into at least one memory, each parity symbol being dependent on a plurality of information symbols of an original set of information symbols and each information symbol of the original set of information symbols contributing to a plurality of an original set of parity symbols, according to a parity algorithm, the plurality of information symbols and plurality of parity symbols being received from different containers;
processing the received parity-encoded data set using, with respect to each parity symbol, a plurality of parallel processing threads of an automated processor system, each thread being allocated a distinct portion of a parity-checking processing task to cover a predefined portion of the parity encoding space, less than the entirety, to determine a parity consistency of the received parity-encoded data set; and
generating an indicia of whether there is parity consistency.

2. The method according to claim 1, further comprising processing the received parity-encoded data set to correct at least two errors in the plurality of information symbols.

3. The method according to claim 1, wherein the plurality of parity symbols comprise two independent parity symbols calculated based on at least each respective information symbol.

4. The method according to claim 3, wherein each parity symbol is processed using two concurrent processing threads.

5. The method according to claim 4, wherein the plurality of processing threads recover erased information symbols, through computation of:

$$\{(2mk,i),((2k+1)m,j),\ldots\},$$

$$\{(-2(k+1)m,i),-2mk,j),\ldots\},$$

$$\{(2mk,j),((2k+1)m,i),\ldots\}, \text{and}$$

$$\{(-2(k+1)m,j),-2mk,i),\ldots\},$$

wherein n is a number of rows of a data matrix, $0 \leq k \leq (n-1)$, and i and j are columns in which the information symbols are erased, and $m=j-i$.

6. The method according to claim 1, wherein the automated processor system comprises a plurality of central processing units, each executing at least one processing thread.

7. The method according to claim 1, wherein the plurality of parity symbols $c_{i,0}, c_{i,1}, \ldots c_{i,n}$ are generated using the parity algorithm based on the information symbols $d_t$, where $i=0, 1, \ldots, n-2$, using:

$$c_{i,0} = \bigoplus_{t=0}^{n-2} d_{t,t-i}, \text{ and } c_{i,1} = \bigoplus_{t=0}^{n-2} d_{t,i-t}.$$

8. At least one non-transitory computer readable medium storing therein instructions configured to control an automated data processing system to perform a method according to claim 1.

9. A method for encoding a parity-encoded data set, comprising:
  receiving a plurality of information symbols dt;
  calculating a plurality of parity symbols ci,0, ci,1, . . . ci,n using an automated processor configured to implement a parity algorithm based on the information symbols dt, where $i=0, 1, \ldots, n-2$, using:

$$c_{i,0} = \bigoplus_{t=0}^{n-2} d_{t,t-i}, \text{ and } c_{i,1} = \bigoplus_{t=0}^{n-2} d_{t,i-t}; \text{ and}$$

storing the plurality of parity symbols and plurality of information symbols in different containers; and
  using, with respect to each parity symbol, a plurality of parallel processing threads of an automated processor system, each thread being allocated a distinct portion of a parity-checking processing task to cover a predefined portion of the parity encoding space, less than the entirety, with respect to each parity symbol, to determine a parity consistency of the received parity-encoded data set.

10. The method according to claim 9, wherein the plurality of parity symbols comprises two parity symbols.

11. The method according to claim 9, further comprising processing the parity-encoded data set to determine a parity consistency.

12. The method according to claim 9, further comprising computing, using a different processing thread of an automated data processing system for each of:

$$\{(2mk,i),((2k+1)m,j),\ldots\},$$

$$\{(-2(k+1)m,i),-2mk,j),\ldots\},$$

$$\{(2mk,j),((2k+1)m,i),\ldots\}, \text{and}$$

$$\{(-2(k+1)m,j),-2mk,i),\ldots\},$$

to recover erased information symbols, wherein n is a number of rows of a data matrix, $0 \leq k \leq (n-1)$, and i and j are columns in which the information symbols are erased, and $m=j-i$.

13. The method according to claim 12, wherein each thread executes using a respectively different arithmetic logic unit.

14. The method according to claim 9, wherein the plurality of information symbols $d_t$ comprise a table of (n−1) rows and n columns, wherein n is prime, further comprising recovering from erasures in the i-th and j-th columns where $0 \leq i < j \leq n-1$, by commencing an iterative chain starting from imaginary point (n−1, i) or (n−1, j) with slope −1 or 1 and then with slope 1 and −1 alternatively, to traverse the sequence pair (n−1−k×(2×(j−i)+1), j), (n−1−k×2×(j−i), i), where $0 \leq k \leq n-1$.

15. The method according to claim 14, wherein four iterative chains starting from (n−1, i) and (n−1, j) with slope 1 and slope −1 respectively and then with slope −1 and 1 alternatively are employed to recover the erasures of the i-th and j-th columns.

16. The method according to claim 15, wherein each of the four iterative chains executes in parallel in a separate processing thread using a respectively distinct arithmetic logic unit.

17. At least one non-transitory computer readable medium storing therein instructions configured to control an automated data processing system to perform a method according to claim 9.

18. A system configured to decode a parity-encoded data set, comprising:
  a memory configured to store a chain of parity-encoded information having a plurality of information symbols and a plurality of parity symbols, each parity symbol being dependent on a plurality of information symbols of an original set of information symbols and each information symbol of the original set of information symbols contributing to a plurality of an original set of parity symbols, according to a parity algorithm, the plurality of information symbols and plurality of parity symbols being received from different containers;
  an automated data processor system configured to process the received parity-encoded data set using, with respect to each parity symbol, a plurality of parallel processing threads, each thread being allocated a distinct portion of a parity-checking processing task to cover a predefined portion of the parity encoding space, less than the entirety, to determine a parity consistency of the received parity-encoded data set; and
  an output from the automated data processor system configured to generate an indicia of whether there is parity consistency.

19. The system according to claim 18, wherein the automated processor system is further configured to process the parity-encoded data set to correct at least two errors in the plurality of information symbols.

20. The system according to claim 18, wherein the plurality of parity symbols comprise two independent parity symbols derived based on at least each respective information symbol.

21. The system according to claim 20, wherein the system is configured to:
  process each parity symbol using at least two concurrently active central processing units; and
  recover erased information symbols, through computation of:

$$\{(2mk,i),((2k+1)m,j),\ldots\},$$

$$\{(-2(k+1)m,i),-2mk,j),\ldots\},$$

$$\{(2mk,j),((2k+1)m,i),\ldots\}, \text{and}$$

$$\{(-2(k+1)m,j),-2mk,i),\ldots\},$$

wherein n is a number of rows of a data matrix, $0 \leq k \leq (n-1)$, and i and j are columns in which the information symbols are erased, and $m=j-i$.

22. The system according to claim 18, wherein the plurality of parity symbols $c_{i,0}$, $c_{i,1}$, ... $c_{i,n}$ are generated by the automated processor system using the parity algorithm based on the information symbols $d_t$, where i=0, 1, ..., n−2, using:

$$c_{i,0} = \bigoplus_{t=0}^{n-2} d_{t,t-i}, \text{ and } c_{i,1} = \bigoplus_{t=0}^{n-2} d_{t,i-t}.$$

23. A system configured to encode a parity-encoded data set, comprising:
- at least one memory location configured to store a plurality of information symbols $d_t$;
- an automated processor system configured to:
  - calculate a plurality of parity symbols $c_{i,0}$, $c_{i,1}$, ... $c_{i,n}$ using a parity algorithm based on the information symbols $d_t$, where i=0, 1, ..., n−2, using:

$$c_{i,0} = \bigoplus_{t=0}^{n-2} d_{t,t-i}, \text{ and } c_{i,1} = \bigoplus_{t=0}^{n-2} d_{t,i-t}; \text{ and}$$

- execute a plurality of concurrent processing threads, each thread being allocated to a distinct portion of a parity-checking processing task to cover a predefined portion of the parity encoding space, less than the entirety, with respect to each parity symbol, to determine a parity consistency of the received parity-encoded data set; and
- at least one memory location configured to store the plurality of parity symbols and plurality of information symbols.

24. The system according to claim 23, wherein the plurality of parity symbols comprises two parity symbols, and the automated processor system is further configured to process the parity-encoded data set to determine a parity consistency.

25. The system according to claim 23, wherein the automated processor system comprises a plurality of arithmetic logic units, configured to compute, using a different concurrent processing thread in at least two different arithmetic processing units for each of:

$$\{(2mk,i),((2k+1)m,j), \ldots\},$$

$$\{(-2(k+1)m,i),-2mk,j), \ldots\},$$

$$\{(2mk,j),((2k+1)m,i), \ldots\}, \text{and}$$

$$\{(-2(k+1)m,j),-2mk,i), \ldots\},$$

to recover erased information symbols, wherein n is a number of rows of a data matrix, $0 \leq k \leq (n-1)$, and i and j are columns in which the information symbols are erased, and m=j−i.

26. The system according to claim 23, wherein the plurality of information symbols $d_t$ comprise a table of (n−1) rows and n columns, wherein n is prime, further comprising recovering from erasures in the i-th and j-th columns where $0 \leq i < j \leq n-1$, by commencing an iterative chain starting from imaginary point (n−1, i) or (n−1, j) with slope −1 or 1 and then with slope 1 and −1 alternatively, to traverse the sequence pair (n−1−k×(2×(j−i)+1), j), (n−1−k×2×(j−i), i), where $0 \leq k \leq n-1$.

27. The system according to claim 26, wherein the automated processor system is configured to execute four concurrent iterative chains in parallel, in respectively different arithmetic logic units, starting from (n−1, i) and (n−1, j) with slope 1 and slope −1 respectively and then with slope −1 and 1 alternatively, to recover the erasures of the i-th and j-th columns.

* * * * *